United States Patent
Eimitsu

(10) Patent No.: US 12,040,806 B2
(45) Date of Patent: Jul. 16, 2024

(54) SEMICONDUCTOR INTEGRATED CIRCUIT, PHASE LOCKED LOOP (PLL) CIRCUIT, AND SYSTEM

(71) Applicant: Kioxia Corporation, Tokyo (JP)

(72) Inventor: Masatomo Eimitsu, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/176,339

(22) Filed: Feb. 28, 2023

(65) Prior Publication Data

US 2023/0403018 A1 Dec. 14, 2023

(30) Foreign Application Priority Data

Jun. 14, 2022 (JP) ................................. 2022-095924

(51) Int. Cl.
  *H03L 7/183* (2006.01)
  *H03L 7/089* (2006.01)
  *G11C 7/22* (2006.01)

(52) U.S. Cl.
  CPC ............ *H03L 7/183* (2013.01); *H03L 7/0891* (2013.01); *G11C 7/222* (2013.01)

(58) Field of Classification Search
  CPC ........ H03L 7/183; H03L 7/0891; G11C 7/222
  See application file for complete search history.

(56) References Cited

U.S. PATENT DOCUMENTS

| | | | | |
|---|---|---|---|---|
| 4,347,484 A | * | 8/1982 | Vandegraaf | H03L 7/083 331/25 |
| 7,856,212 B2 | * | 12/2010 | Pellerano | H03L 7/18 455/260 |
| 9,847,785 B2 | | 12/2017 | Nakai | |
| 10,135,452 B2 | * | 11/2018 | Cherniak | H03B 5/1212 |
| 10,171,053 B2 | * | 1/2019 | Soliman | H03F 1/0227 |
| 10,483,989 B2 | * | 11/2019 | Masuda | H03L 7/081 |
| 10,629,553 B2 | * | 4/2020 | Soliman | H05B 47/19 |
| 10,840,921 B2 | * | 11/2020 | Konradsson | H03L 7/0991 |
| 10,855,296 B2 | * | 12/2020 | Bassi | H03L 7/099 |

(Continued)

FOREIGN PATENT DOCUMENTS

| | | |
|---|---|---|
| JP | 2014-204418 A | 10/2014 |
| JP | 2017-038330 A | 2/2017 |
| JP | 6234545 B2 | 11/2017 |

*Primary Examiner* — Adam D Houston
(74) *Attorney, Agent, or Firm* — Kim & Stewart LLP

(57) ABSTRACT

A semiconductor integrated circuit includes an oscillation circuit and first and second current control circuits. The oscillation circuit includes a first series circuit having inverters, including a first inverter, connected in series and a second series circuit having inverters, including a second inverter, connected in series. An oscillation signal is output from the first series circuit. The first current control circuit is connected between a current source and an output terminal of the first inverter and configured to control a current from the current source into the first series circuit in accordance with a first signal synchronized with a clock signal. The second current control circuit is connected between an output terminal of the second inverter and a reference voltage node and configured to control a current from the second series circuit to the reference voltage node in accordance with a second signal synchronized with the clock signal.

20 Claims, 13 Drawing Sheets

(56) References Cited

U.S. PATENT DOCUMENTS

| | | | |
|---|---|---|---|
| 11,356,107 B1* | 6/2022 | Bhat | H03L 7/085 |
| 2012/0038396 A1* | 2/2012 | Shima | H03L 7/08 |
| | | | 327/117 |
| 2014/0043103 A1* | 2/2014 | Taghivand | H03B 19/14 |
| | | | 331/34 |
| 2014/0120847 A1* | 5/2014 | Shima | H03K 23/66 |
| | | | 455/73 |
| 2014/0266454 A1* | 9/2014 | Testi | H03G 5/24 |
| | | | 330/284 |
| 2014/0266480 A1* | 9/2014 | Li | H03B 5/1243 |
| | | | 331/117 FE |
| 2017/0264333 A1* | 9/2017 | Hoshino | H03L 7/099 |
| 2018/0226979 A1* | 8/2018 | Kim | H03L 7/083 |
| 2019/0199362 A1* | 6/2019 | Yagi | G01R 31/2607 |
| 2022/0247415 A1* | 8/2022 | Kim | H03L 7/099 |
| 2023/0132901 A1* | 5/2023 | Lee | H03K 3/037 |
| | | | 375/375 |
| 2023/0403018 A1* | 12/2023 | Eimitsu | H03L 7/0891 |

\* cited by examiner

SEMICONDUCTOR INTEGRATED CIRCUIT, PHASE LOCKED LOOP (PLL) CIRCUIT, AND SYSTEM

CROSS-REFERENCE TO RELATED APPLICATION

This application is based upon and claims the benefit of priority from Japanese Patent Application No. 2022-095924, filed Jun. 14, 2022, the entire contents of which are incorporated herein by reference.

FIELD

Embodiments described herein relate generally to a semiconductor integrated circuit, a PLL circuit, and a system having the same.

BACKGROUND

Oscillation circuits that periodically short-circuit output nodes of a pair of inverters that output differential oscillation signals in synchronization with an input clock signal are known. Such a type of oscillation circuit is configured such that a plurality of pairs of inverters including a pair of inverters are connected in a ring form. When output nodes of the pair of inverters are not short-circuited, a free-run oscillation signal at an indefinite frequency is output.

In such a type of oscillation circuit, the frequency of the free-run oscillation signal can be adjusted to a frequency lower than this frequency. However, it is not easy to adjust the frequency of the free-run oscillation signal so that the frequency is increased (i.e., raised) For that reason, an adjustment range of the frequency is limited.

DETAILED DESCRIPTION

Embodiments provide a semiconductor integrated circuit, a PLL circuit, and a system (may be referred to as a signal processing device) capable of appropriately widening an adjustment range of a frequency of an oscillation signal.

In general, according to an embodiment, a semiconductor integrated circuit includes an oscillation circuit, a first current control circuit, and a second current control circuit. The oscillation circuit includes a first series circuit having a plurality of inverters, one of which is a first inverter, connected in series and a second series circuit having a plurality of inverters, one of which is a second inverter, connected in series. An oscillation signal is output from the first series circuit. The first current control circuit is connected between a current source and an output terminal of the first inverter and configured to control a current from the current source into the first series circuit in accordance with a first signal synchronized with a clock signal. The second current control circuit is connected between an output terminal of the second inverter and a reference voltage node and configured to control a current from the second series circuit to the reference voltage node in accordance with a second signal synchronized with the clock signal.

Hereinafter, a semiconductor integrated circuit, a PLL circuit, and a signal processing device according to embodiments will be described with reference to the drawings. Hereinafter, major components of the semiconductor integrated circuit, the PLL circuit, and the signal processing device will be mainly described. The semiconductor integrated circuit, the PLL circuit, and the signal processing device may be able to have components or functions which are not illustrated or described. In the following description, components or functions which are not illustrated or described are not excluded.

First Embodiment

Figure 1:
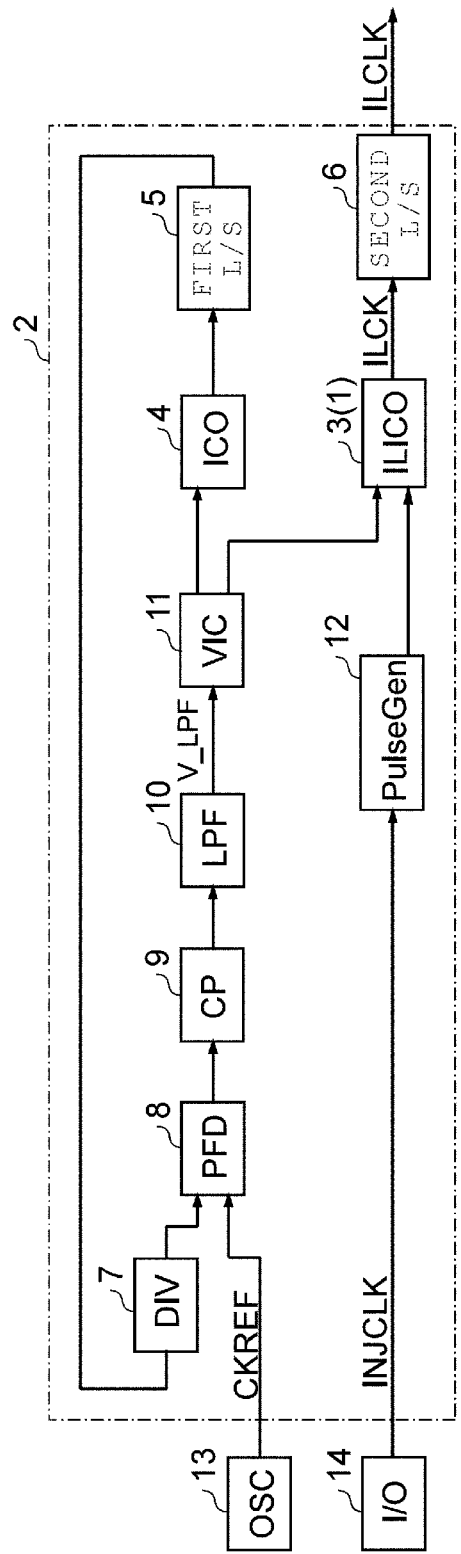
FIG. 1 is a block diagram illustrating an overall configuration of a phase locked loop (PLL) circuit including a semiconductor integrated circuit according to a first embodiment.

FIG. 1 is a block diagram illustrating an overall configuration of a phase locked loop (PLL) circuit 2 including a semiconductor integrated circuit 1 according to a first embodiment.

The PLL circuit 2 in FIG. 1 includes an injection lock current (I) control oscillator (ILICO) 3, a current (I) control oscillator (ICO) 4, a first level shifter (L/S) 5, a second level shifter (L/S) 6, a divider (DIV) 7, a phase frequency detector (PFD) 8, a charge pump (CP) 9, a loop filter (LPF) 10, a voltage current (I) converter (VIC) 11, and a pulse generator (PulseGen) 12.

A reference oscillation signal CKREF output from an oscillator (OSC) 13 and an input clock signal INJCLK from an input/output interface circuit (I/O) 14 are input to the PLL circuit 2 in FIG. 1.

The ILICO 3 is a current control oscillator that has an injection lock function. As will be described below, the ILICO 3 locks an oscillation frequency by injecting a current from the VIC 11, which is a current source, and drawing out a current to a reference voltage node (for example, a grounding voltage node). The ILICO 3 generates and outputs an oscillation signal ILCK at the same frequency as the frequency of the input clock signal INJCLK input to the PLL circuit 2.

The ICO 4 is a current control oscillator that has no injection lock function. The ICO 4 generates and outputs an oscillation signal synchronized with the reference oscillation signal CKREF from the OSC 13. More specifically, the ICO 4 generates and outputs an oscillation signal at a frequency equal to a frequency of the reference oscillation signal CKREF multiplied by a certain value.

The first L/S 5 changes a signal level of the oscillation signal output from the ICO 4. For example, the first L/S 5 makes a signal amplitude of the oscillation signal output from the ICO 4 larger. The second L/S 6 changes a signal level of the oscillation signal ILCK output from the ILICO 3. For example, the second L/S 6 makes a signal amplitude of the oscillation signal ILCK output from the ILICO 3 larger. The oscillation signal ILCLK output from the second L/S 6 is an oscillation signal ILCLK output from the PLL circuit 2.

The DIV 7 divides the oscillation signal output from the first L/S 5 to generate a frequency-divided signal. Any division ratio of the DIV 7 can be used. The PFD 8 detects a phase difference and a frequency difference between the frequency-divided signal output from the DIV 7 and the reference oscillation signal CKREF from the OSC 13 and outputs a signal in accordance with the phase difference and the frequency difference.

The CP 9 generates a current signal in accordance with an output signal of the PFD 8. The LPF 10 removes an unnecessary frequency component contained in the current signal output from the CP 9 to generate a control voltage V_LPF. The VIC 11 generates a current signal in accordance with the control voltage V_LPF. The current signal generated by the VIC 11 is supplied to the ILICO 3 and the ICO 4. The ILICO 3 and the ICO 4 control a frequency of the oscillation signal in accordance with the current signal generated by the VIC 11. More specifically, the ICO 4 performs frequency control such that an oscillation signal at a frequency equal to the frequency of the reference oscillation signal CKREF multiplied by a certain value is output. The ILICO 3 performs frequency control such that an oscillation signal at the same frequency as the frequency of the input clock signal INJCLK from the I/O 14 is output.

The pulse generator 12 generates a second signal INJ in synchronization with the input clock signal INJCLK from the I/O 14. The second signal INJ is a pulse signal that has a pulse width synchronized with a rising edge or a falling edge of the input clock signal INJCLK. The second signal INJ generated by the pulse generator 12 is input to the ILICO 3. The ICO (second oscillator) 4 in FIG. 1 is PLL-controlled by a feedback control circuit that includes the first L/S 5, the DIV 7, the PFD 8, the CP 9, the LPF 10, and the VIC 11. Conversely, the ILICO (first oscillator) 3 is not PLL-controlled.

The semiconductor integrated circuit 1 according to the present embodiment includes at least the ILICO 3 in FIG. 1. The semiconductor integrated circuit 1 according to the present embodiment may include at least one block other than the ILICO 3 in the PLL circuit 2 in FIG. 1.

Figure 2:
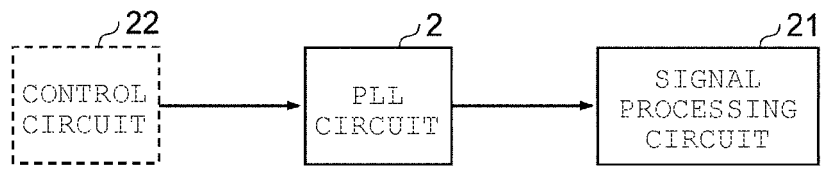
FIG. 2 is a block diagram illustrating a signal processing device including the PLL circuit in FIG. 1.

FIG. 2 is a block diagram illustrating a signal processing device 20 including the PLL circuit 2 in FIG. 1. The signal processing device 20 in FIG. 2 includes the PLL circuit 2 and a signal processing circuit 21. The oscillation signal ILCLK output from the PLL circuit 2 is input to the signal processing circuit 21. The signal processing circuit 21 performs various types of signal processing in synchronization with the oscillation signal ILCLK output from the PLL circuit 2. Specific content of the signal processing performed by the signal processing circuit 21 does not matter.

The signal processing circuit 21 may have, for example, a function of a storage control unit that controls a storage device (not illustrated). In this case, the signal processing circuit 21 controls writing of data to the storage device and reading of data from the storage device in synchronization with the oscillation signal ILCLK output from the PLL circuit 2.

For example, a control circuit 22 is connected to the I/O 14 that inputs the input clock signal INJCLK to the PLL circuit 2. The control circuit 22 generates the input clock signal INJCLK. The I/O 14 buffers the input clock signal INJCLK from the control circuit 22 to input the input clock signal INJCLK to the pulse generator 12 of the PLL circuit 2. The control circuit 22 is specifically a central processing unit (CPU) or the like.

Figure 3:
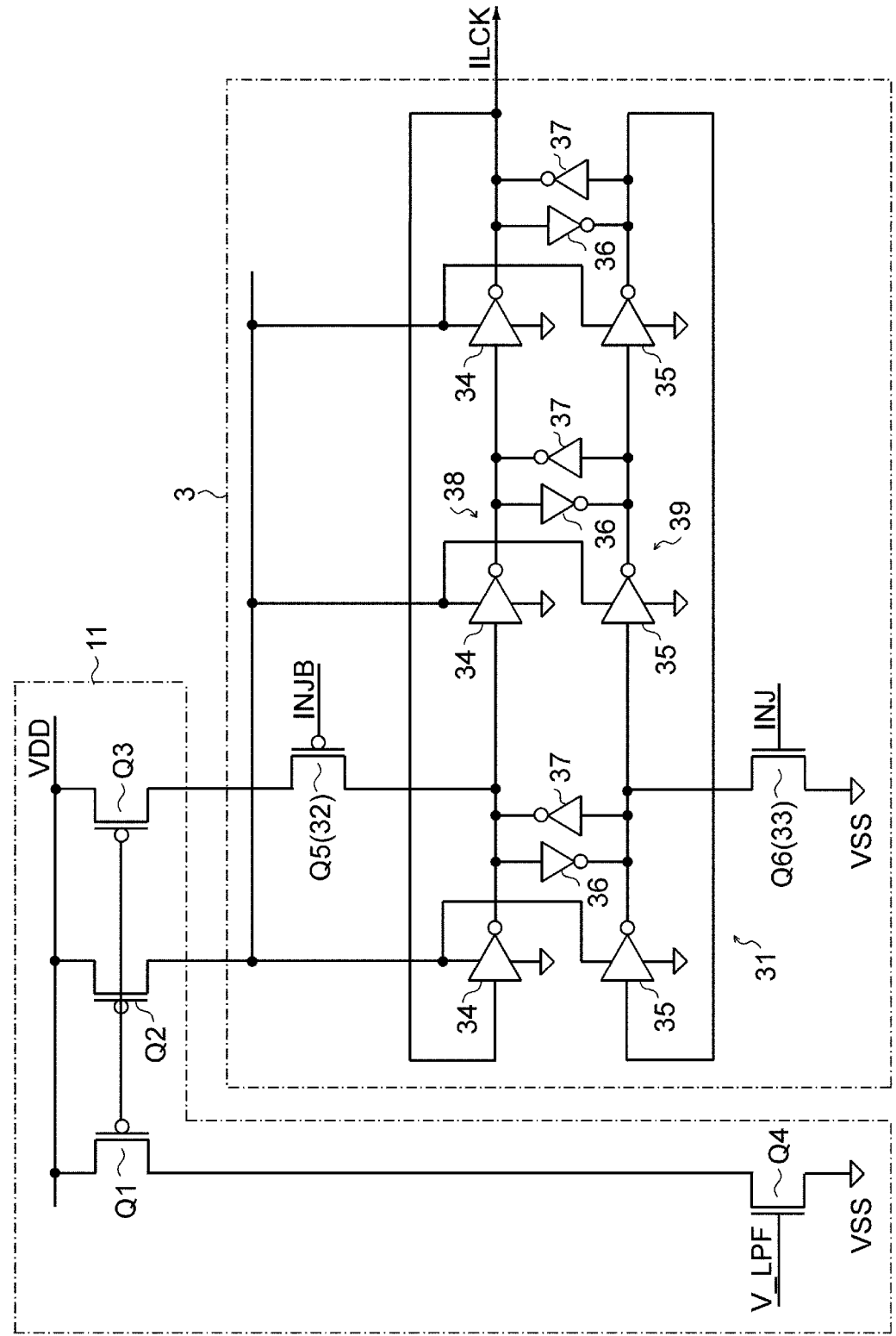
FIG. 3 is a circuit diagram illustrating a circuit configuration of a voltage current converter (VIC) and an injection lock current control oscillator (ILICO) in FIG. 1.

FIG. 3 is a circuit diagram illustrating a circuit configuration of the VIC 11 and the ILICO 3 in FIG. 1. The VIC 11 functions as a current source that supplies the ILICO 3 with a current at a level in accordance with the control voltage V_LPF output from the LPF 10.

As illustrated in FIG. 3, the VIC 11 includes three PMOS transistors Q1 to Q3 and one NMOS transistor Q4. The PMOS transistor Q1 and the NMOS transistor Q4 are cascade-connected between a power voltage node VDD and a grounding voltage node VSS. More specifically, a source of the PMOS transistor Q1 is connected to the power voltage node VDD and a drain of the PMOS transistor Q1 is connected to a drain of the NMOS transistor Q4. A source of the NMOS transistor Q4 is connected to the grounding voltage node VSS. The control voltage V_LPF output from the LPF 10 is input to a gate of the NMOS transistor Q4.

The gates of the PMOS transistors Q1, Q2, and Q3 are connected to each other and the sources of the PMOS transistors Q1, Q2, and Q3 are connected to the power voltage node VDD. That is, the PMOS transistors Q1, Q2, and Q3 configure a current mirror circuit.

A level of a current flowing between the source and drain of the PMOS transistor Q1 is changed in accordance with a voltage level of the control voltage V_LPF output from the LPF 10, and a current of a level proportional to the current flowing between the source and drain of the PMOS transistor Q1 flows between the source and drain of the PMOS transistor Q2 and between the source and drain of the PMOS transistor Q3. The drain of the PMOS transistor Q2 and the drain of the PMOS transistor Q3 are connected to the ILICO 3.

In this way, it is possible to control the level of the currents between the sources and drains of the PMOS transistors Q1, Q2, and Q3 in accordance with the voltage level of the control voltage V_LPF output from the LPF 10.

The ILICO 3 in FIG. 3 includes an oscillation circuit 31, a first current control circuit 32, and a second current control circuit 33.

The oscillation circuit 31 includes a pair of inverters 34 and 35 outputting differential oscillation signals. In the present specification, the pair of inverters 34 and 35 are referred to as a first inverter 34 and a second inverter 35, respectively. As will be described below, the oscillation circuit 31 includes a first series circuit 38 that includes the plurality of first inverters 34 and a second series circuit 39 that includes the plurality of second inverters 35. The oscillation signal ILCK output from the first series circuit 38 or the second series circuit 39 is output from the oscillation circuit 31 and is input to the second L/S 6 in FIG. 1.

The first current control circuit 32 injects a current from the VIC 11 to an output node of the first inverter 34 in accordance with a first signal INJB synchronized with the input clock signal INJCLK. The second current control circuit 33 extracts a current from an output node of the second inverter 35 to a reference voltage node in accordance with the second signal INJ synchronized with the input clock signal INJCLK. The reference voltage node is a node of which voltage level is fixed. In the present specification, an example in which the reference voltage node is a grounding voltage node VSS will be mainly described.

In this way, the oscillation circuit 31 injects a current to the output node of the first inverter 34 in accordance with the first signal INJB and the second signal INJ synchronized with the input clock signal INJCLK and extracts a current from the output node of the second inverter 35, and thus it is possible not only to lower the oscillation frequency of the oscillation circuit 31 but also to raise the oscillation frequency, and widen a frequency adjustment range.

Each of the first inverter 34 and the second inverter 35 includes first and second power terminals. A current generated in the VIC 11 is supplied to the first power terminal of each of the first inverter 34 and the second inverter 35. More specifically, a current between the source and drain of the transistor Q2 in the VIC 11 is supplied to the first power terminal of each of the first inverter 34 and the second inverter 35.

The second power terminal of each of the first inverter 34 and the second inverter 35 is connected to the grounding voltage node VSS.

Two inverters (hereinafter, referred to as third inverters) 36 and 37 are connected in mutually reverse directions between the output node of the first inverter 34 and the output node of the second inverter 35. The two third inverters 36 and 37 are connected in mutually reverse directions so that the output node of the first inverter 34 and the output node of the second inverter 35 can be inverted. Accordingly, differential oscillation signals of which phases are different by 180 degrees are output from the output nodes of the pair of inverters 34 and 35 (the first inverter 34 and the second inverter 35).

More specifically, the oscillation circuit 31 includes the first series circuit 38 and the second series circuit 39. The first series circuit 38 includes two or more first inverters 34 connected in series. The second series circuit 39 includes two or more second inverters 35 connected in series.

The output node of a last one of the first inverters 34 in the signal propagating direction in the first series circuit 38 is connected to an input node of a first one of the first inverters 34 in the signal propagating direction. That is, the first series circuit 38 configures a ring oscillator. Similarly, the output node of a last one of the second inverters 35 in the signal propagating direction in the second series circuit 39 is connected to an input node of a first one of the second inverters 35 in the signal propagating direction. That is, the second series circuit 39 configures a ring oscillator.

The number of the first inverters 34 in the first series circuit 38 is the same as the number of the second inverters 35 in the second series circuit 39. It is necessary for the number of the first inverters 34 in the first series circuit 38 to be the same as the number of the second inverters 35 in the second series circuit 39, but the number can be adjusted to any applicable number. More specifically, the number of the inverters in the series circuit may be two or more and may be odd or even. A specific circuit configuration in which the number of inverters is even will be described below.

The first current control circuit 32 injects a current from the VIC 11, which is a current source, to the output node of one inverter 34 in the first series circuit 38 in accordance with the first signal INJB synchronized with the input clock signal INJCLK. The second current control circuit 33 extracts a current from the output node of one inverter 35 in the second series circuit 39 in accordance with the second signal INJ synchronized with the input clock signal INJCLK.

As described above, the pulse generator 12 generates the first signal INJB and the second signal INJ, which are pulse signals synchronized with the rising edge or the falling edge of the input clock signal INJCLK. The first current control circuit 32 injects a current to the output node of one first inverter 34 in the first series circuit 38 for a period in which the level of the first signal INJB generated by the pulse generator 12 is active (low). The second current control circuit 33 extracts a current from the output node of one second inverter 35 in the second series circuit 39 for a period in which the level of the second signal INJ is active (high).

In this way, the first current control circuit 32 injects the current to the output node of one first inverter 34 in synchronization with the rising edge or the falling edge of the input clock signal INJCLK. The second current control circuit 33 extracts the current from the output node of one second inverter 35 in synchronization with the rising edge or the falling edge of the input clock signal INJCLK. Accordingly, frequency control can be performed such that an oscillation frequency of a free-run oscillation signal at an indefinite oscillation frequency in the oscillation circuit 31 is increased or decreased in accordance with the oscillation frequency of the input clock signal INJCLK.

More specifically, the first current control circuit 32 injects a current to the output node of one of the first inverters 34 (the first one in the example of FIG. 3) in the first series circuit 38. The second current control circuit 33 extracts a current from the output node of one of the second inverters 35 (the first one in the example of FIG. 3) in the second series circuit 39. That is, the first current control circuit 32 and the second current control circuit 33 inject and extract the current to and from the output nodes of the first inverter 34 and the second inverter 35 at the same connection positions (the first one in the example of FIG. 3) in the first series circuit 38 and the second series circuit 39.

The first current control circuit 32 includes, for example, a PMOS transistor Q5. A source of the PMOS transistor Q5 is connected to the drain of the PMOS transistor Q3 in the VIC 11. A drain of the PMOS transistor Q5 is connected to, for example, the output node of the first one of the first inverters 34 in the first series circuit 38. An inverted signal INJB of the second signal INJ generated by the pulse generator 12 is input to a gate of the PMOS transistor Q5. When the second signal INJ becomes high, the inverted signal INJB becomes low to turn on the PMOS transistor Q5. As a result, a current between the source and drain of the PMOS transistor Q3 in the VIC 11 passes between the source and drain of the PMOS transistor Q5 to be injected to the output node of the first one of the first inverters 34.

The second current control circuit 33 includes, for example, an NMOS transistor Q6. A drain of the NMOS transistor Q6 is connected to the output node of the first one of the second inverters 35 in the second series circuit 39. A source of the NMOS transistor Q6 is connected to the grounding voltage node VSS. The second signal INJ generated by the pulse generator 12 is input to a gate of the NMOS transistor Q6. The second signal INJ becomes high in synchronization with a rising edge of the input clock signal INJCLK to turn on the NMOS transistor Q6. As a result, the current is extracted from the output node of the first one of the second inverters 35 to the grounding voltage node VSS.

In FIG. 3, the current is injected to the output node of the first one of the first inverters 34 in the first series circuit 38 and the current is extracted from the output node of the first one of the second inverters 35 in the second series circuit 39. Alternatively, the current may be injected to the output node of any other one of the first inverters 34 in the first series circuit 38 and the current may be extracted from the output node of any other one of the second inverters 35 in the second series circuit 39.

Figure 4:
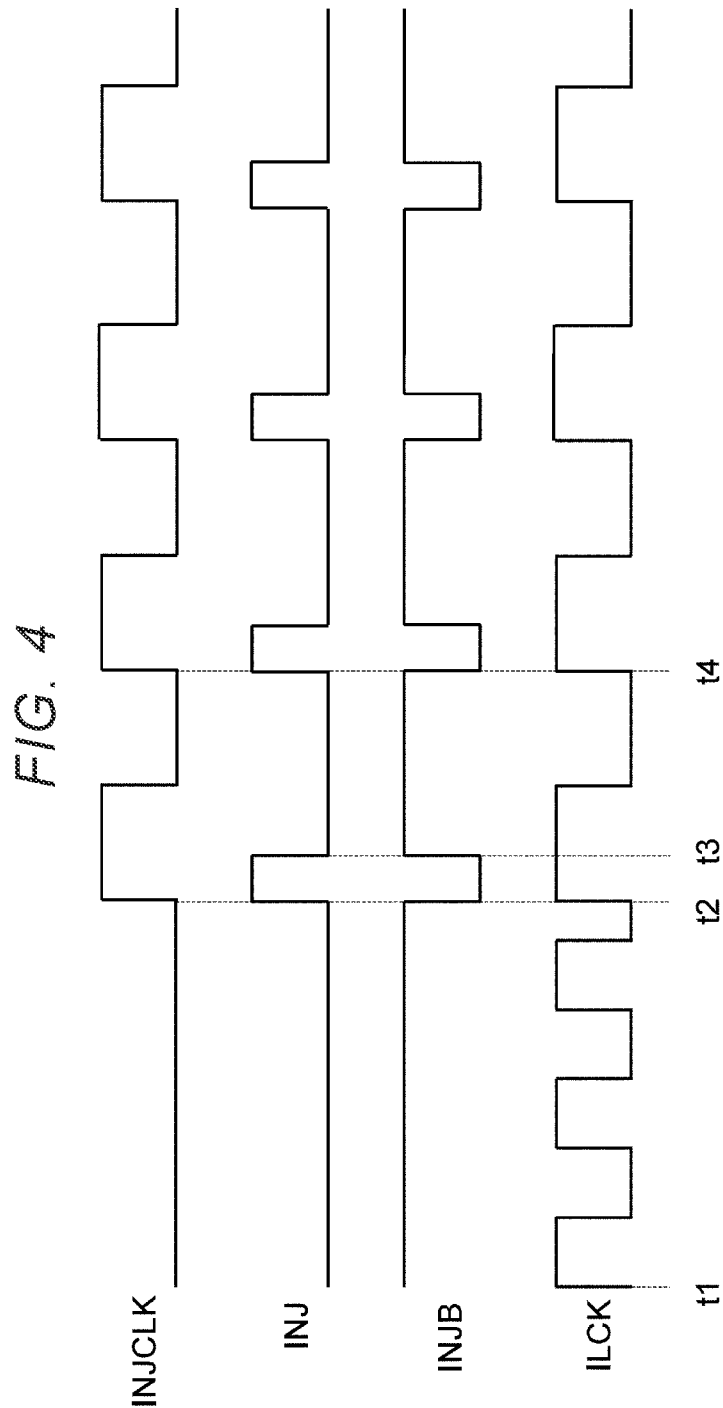
FIG. 4 is a timing diagram of an input clock signal INJCLK, a second signal INJ, a first signal INJB, and an oscillation signal ILCK.

FIG. 4 is a timing diagram of the input clock signal INJCLK input from the I/O 14 to the PLL circuit 2, the second signal INJ generated by the pulse generator 12, the inverted signal INJB, and the oscillation signal ILCK output from the ILICO 3.

A period of times t1 to t2 is a period in which the input clock signal INJCLK is stopped. For this period, the ILICO 3 outputs the free-run oscillation signal ILCK of which oscillation frequency depends on the oscillation frequency of the oscillator 13. When the input clock signal INJCLK is input at time t2, the pulse generator 12 generates the first signal INJB and the second signal INJ, which are pulse signals with pulse widths synchronized with a rising edge of the input clock signal INJCLK. A period in which the second signal INJ is high and a period in which the first signal INJB is low are shorter than a half period of the input clock signal INJCLK. It is noted that the pulse generator 12 may generate one of the first signal INJB and the second signal INJ based on the input clock signal INJCLK and an inverter provided downstream the pulse generator 12 in a signal propagating direction may generate the other of the first signal INJB and the second signal INJ.

For the period in which the first signal INJB is low, that is, a period of a certain pulse width of the first signal INJB, the first current control circuit 32 injects a current from the VIC 11, which is a current source, to the output node of the first one of the first inverters 34. For the period in which the second signal INJ is high, that is, a period of a certain pulse width of the second signal INJ, the first current control circuit 32 extracts a current from the output node of the first one of the second inverters 35 to the grounding voltage node VSS. As a result, the oscillation circuit 31 outputs the oscillation signal ILCK at the same frequency as the frequency of the input clock signal INJCLK.

Figure 5:
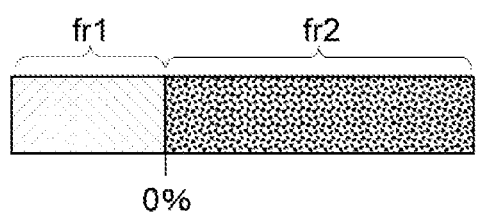
FIG. 5 is a diagram illustrating a frequency range of an oscillation signal output from the ILICO in FIG. 3.

FIG. 5 is a diagram illustrating a frequency range of the oscillation signal ILCK output from the ILICO 3 in FIG. 3. A length in the horizontal direction in FIG. 5 indicates a frequency range which can be adjusted by the ILICO 3. In FIG. 5, 0% indicates that a free-run frequency matches a target frequency, which is a goal. The left of 0% indicates a frequency range (hereinafter, referred to as a first frequency range) fr1 in which the free-run frequency can be increased to the target frequency when the free-run frequency is lower than the target frequency. The right of 0% indicates a frequency range (hereinafter, referred to as a second frequency range) fr2 in which the free-run frequency can be decreased to the target frequency when the free-run frequency is higher than the target frequency.

Figure 6:
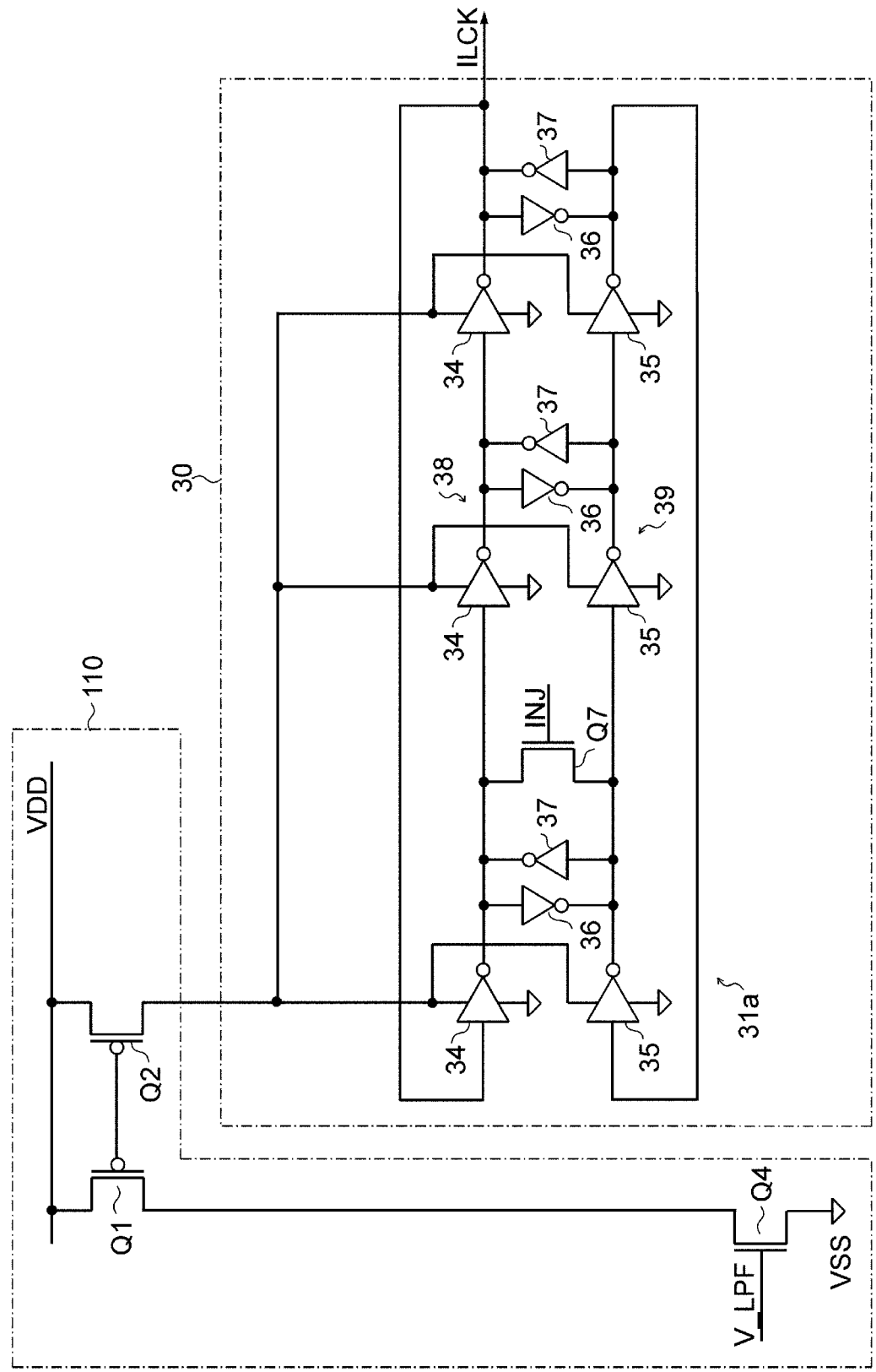
FIG. 6 is a circuit diagram illustrating a circuit configuration of a VIC and an ILICO according to a comparative example.

FIG. 6 is a circuit diagram illustrating a circuit configuration of the VIC 110 and the ILICO 30 according to a comparative example. In FIG. 6, circuit portions common to those in FIG. 3 are denoted by the same reference numerals. Differences from FIG. 3 will be described below.

The VIC 110 in FIG. 6 includes the PMOS transistors Q1 and Q2 and the NMOS transistor Q4. A connection relation among the transistors Q1, Q2, and Q4 is the same as that in FIG. 3. A current in accordance with the control voltage V_LPF output from the LPF 10 flows between the source and drain of the PMOS transistor Q1. The PMOS transistors Q1 and Q2 configure a current mirror circuit. A current in accordance with the control voltage V_LPF output from the LPF 10 flows between the source and drain of the PMOS transistor Q2. This current is supplied to the first power terminals of the first inverters 34 of the first series circuit 38 and the second inverters 35 of the second series circuit 39 in the oscillation circuit 31.

As in FIG. 3, two third inverters 36 and 37 are connected in mutually reverse directions between the output node of the first inverter 34 and the output node of the second inverter 35 in each pair in the first series circuit 38 and the second series circuit 39.

An NMOS transistor Q7 is connected between the output node of one of the first inverters 34 and the output node of one of the second inverters 35 in a certain pair (for example, the first pair) in the first series circuit 38 and the second series circuit 39. Specifically, a drain of the transistor Q7 is connected to the output node of the first inverter 34 and a source of the transistor Q7 is connected to the output node of the second inverter 35.

The second signal INJ output from the pulse generator 12 is input to a gate of the transistor Q7. The transistor Q7 is temporarily turned on at a timing of a rising or falling edge of the input clock signal INJCLK input from the I/O 14 to short-circuit the output nodes of the first inverter 34 and the second inverter 35. As a result, an oscillation frequency of the oscillation signal ILCK output from the oscillation circuit 31a can be matched with the oscillation frequency of the input clock signal INJCLK.

The ILICO 30 in FIG. 6 does not include the first current control circuit 32 and the second current control circuit 33 in FIG. 3. The VIC 110 in FIG. 6 does not include the PMOS transistor Q3 in FIG. 3. For that reason, in the ILICO 30 in FIG. 6, injection of a current to the output node of the first one of the first inverters 34 and extraction of a current from the output node of the first one of the second inverters 35 are not performed. Instead, in the ILICO 30 in FIG. 6, the output node of the first one of the first inverters 34 and the output node of the first one of the second inverters 35 are short-circuited in the transistor Q7 by the second signal INJ synchronized with a rising edge of the input clock signal INJCLK.

Figure 7:
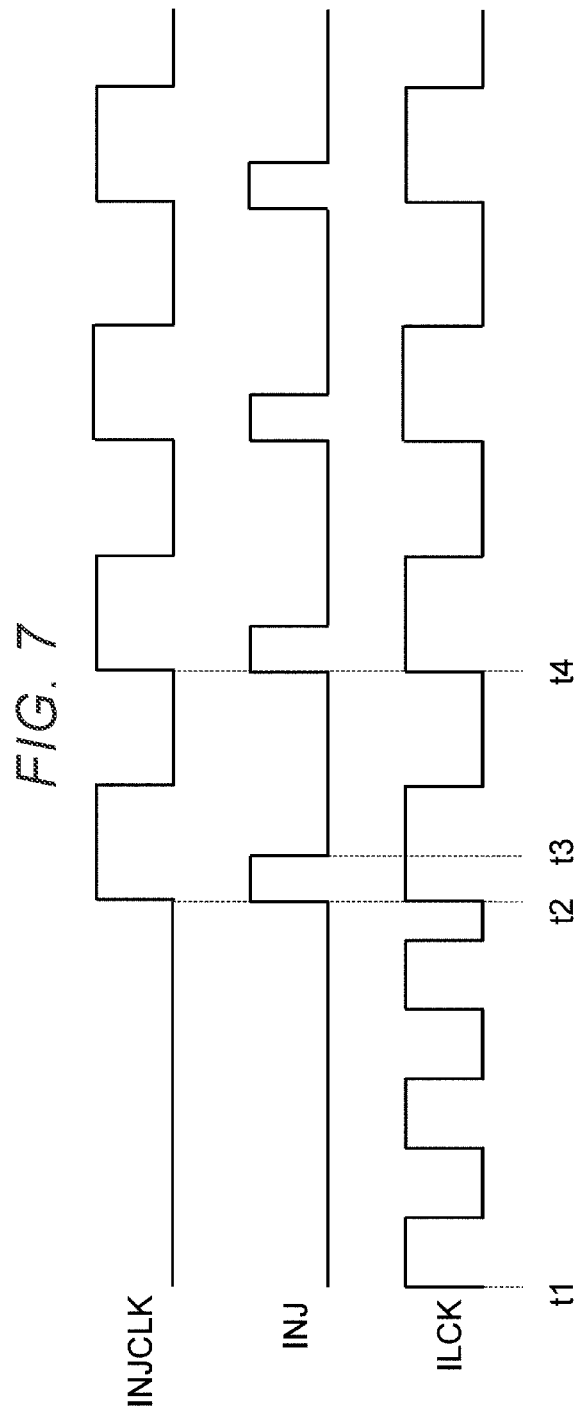
FIG. 7 is a timing diagram of the ILICO according to the comparative example illustrated in FIG. 6.

FIG. 7 is a timing diagram of the ILICO according to a comparative example illustrated in FIG. 6. The timing diagram of FIG. 7 is substantially the same as that of FIG. 4 except that there is no first signal INJB, which is an inverted signal of the second signal INJ. The pulse generator 12 generates the second signal INJ with a certain pulse width in synchronization with a rising edge of the input clock signal INJCLK. The transistor Q7 in the ILICO 30 is turned on for a period of a pulse width of the second signal INJ to short-circuit the output node of the first one of the first inverters 34 and the output node of the first one of the second inverters 35.

Figure 8:
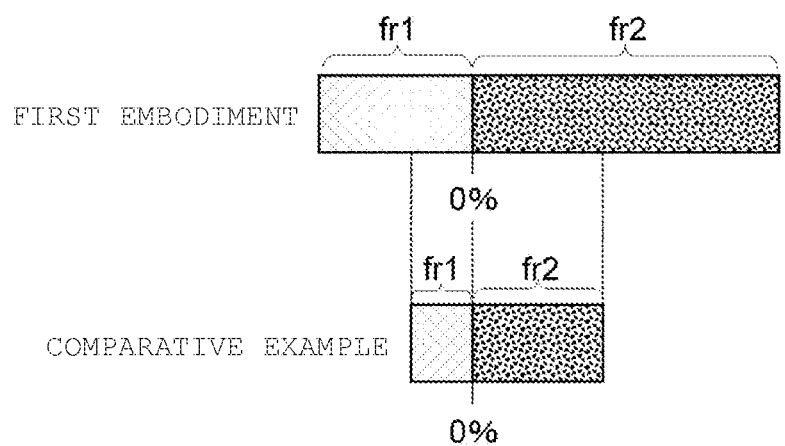
FIG. 8 is a diagram illustrating a frequency range of an oscillation signal output from the ILICO in FIG. 6.

FIG. 8 is a diagram illustrating a frequency range of an oscillation signal output from the ILICO 30 in FIG. 6. As illustrated in FIG. 8, in the ILICO 30 according to the comparative example in FIG. 6, both the first frequency range fr1 in which the free-run frequency can be increased to the target frequency when the free-run frequency is lower than the target frequency and the second frequency range fr2 in which the free-run frequency can be decreased to the target frequency when the free-run frequency is higher than the target frequency are narrower than in the ILICO 3 according to the first embodiment in FIG. 3.

In this way, according to the first embodiment, the current is injected to the output node of one of the first inverters 34 in the oscillation circuit 31 and the current is extracted from the output node of one of the second inverters 35 of the same pair in synchronization with a rising edge or a falling edge of the input clock signal INJCLK. In this configuration, the oscillation frequency of the oscillation signal ILCK of the ILICO 3 can be locked even when the range of the oscillation frequency of the input clock signal INJCLK is wide.

In particular, in the oscillation circuit 31 according to the first embodiment, it is possible to widen the second frequency range fr2 in which the free-run frequency can be decreased to the target frequency when the free-run frequency is higher than the target frequency. It is also possible to widen the first frequency range fr1 in which the free-run frequency can be increased to the target frequency when the free-run frequency is lower than the target frequency.

Second Embodiment

The first current control circuit 32 and the second current control circuit 33 according to the first embodiment perform current control at only one of the rising edge or the falling edge of the input clock signal INJCLK. Alternatively, a configuration in which current control is performed at both the edges may also be implemented.

Figure 9:
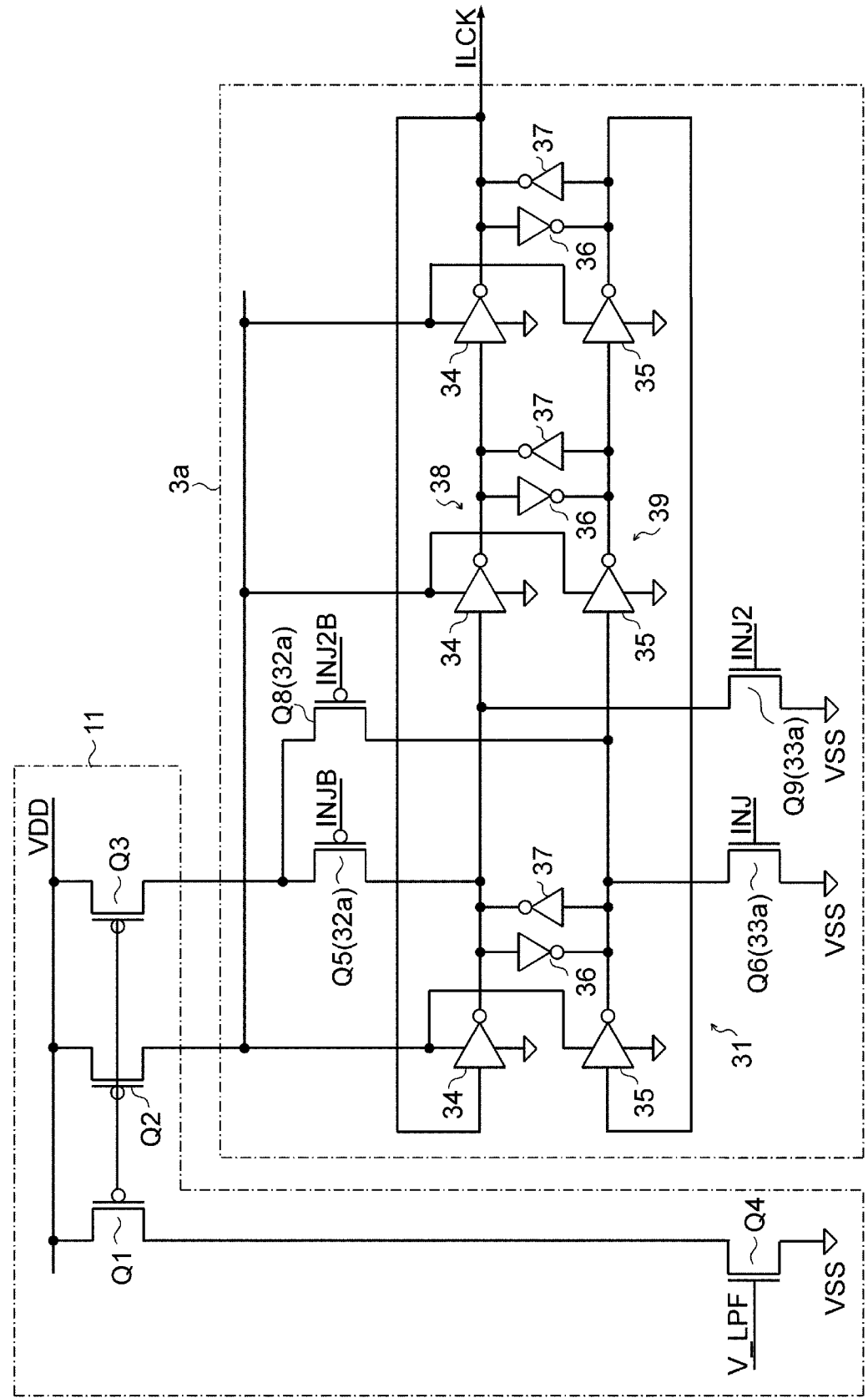
FIG. 9 is a circuit diagram illustrating a circuit configuration of a VIC and an ILICO according to a second embodiment.

FIG. 9 is a circuit diagram illustrating a circuit configuration of a VIC 11 and an ILICO 3a according to a second embodiment. The VIC 11 in FIG. 9 has a configuration similar to the VIC 11 in FIG. 3. The ILICO 3a in FIG. 9 includes the oscillation circuit 31 that has the same circuit configuration as that of FIG. 3, a first current control circuit 32a that has a circuit configuration different from that of FIG. 3, and a second current control circuit 33a that has a circuit configuration different from that of FIG. 3.

The first current control circuit 32a in FIG. 9 includes the same PMOS transistor Q5 as that of FIG. 3 and includes a PMOS transistor Q8. A source of the transistor Q8 is connected to the drain of the transistor Q3 and a drain of the transistor Q8 is connected to the output node of one of the second inverters 35 (for example, the first one in the signal propagating direction) in the second series circuit 39.

Hereinafter, a pulse signal input to the gate of the transistor Q5 is referred to as a first signal INJB, a pulse signal input to the gate of the transistor Q6 is referred to as a second signal INJ, a pulse signal input to a gate of the transistor Q8 is referred to as a third signal INJ2B, and a pulse signal input to a gate of a transistor Q9 is referred to as a fourth signal INJ2. The pulse generator 12 generates the second signal INJ with a certain pulse width and the first signal INJB, which is an inverted signal of the second signal INJ, in synchronization with a rising edge of the input clock signal INJCLK, and generates the fourth signal INJ2 with a certain pulse width and the third signal INJ2B, which is an inverted signal of the fourth signal INJ2, in synchronization with a falling edge of the input clock signal INJCLK.

The second current control circuit 33a in FIG. 9 includes the NMOS transistor Q6 similar to that of FIG. 3 and includes the NMOS transistor Q9. A drain of the transistor Q9 is connected to the output node of one of the first inverters 34 (for example, the first one) in the first series circuit 38 and a source of the transistor Q9 is connected to the grounding voltage node VSS. The fourth signal INJ2 is input to the gate of the transistor Q9.

More specifically, the first current control circuit 32a in FIG. 9 injects a current to the output node of one inverter 34 in the first series circuit 38 in accordance with the first signal INJB and extracts a current from the output node of one inverter 35 in the second series circuit 39 in accordance with the third signal INJ2B. The second current control circuit 33a extracts a current from the output node of one inverter 35 in the second series circuit 39 in accordance with the second signal INJ and extracts a current from the output node of one inverter 34 in the first series circuit 38 in accordance with the fourth signal INJ2.

Figure 10:
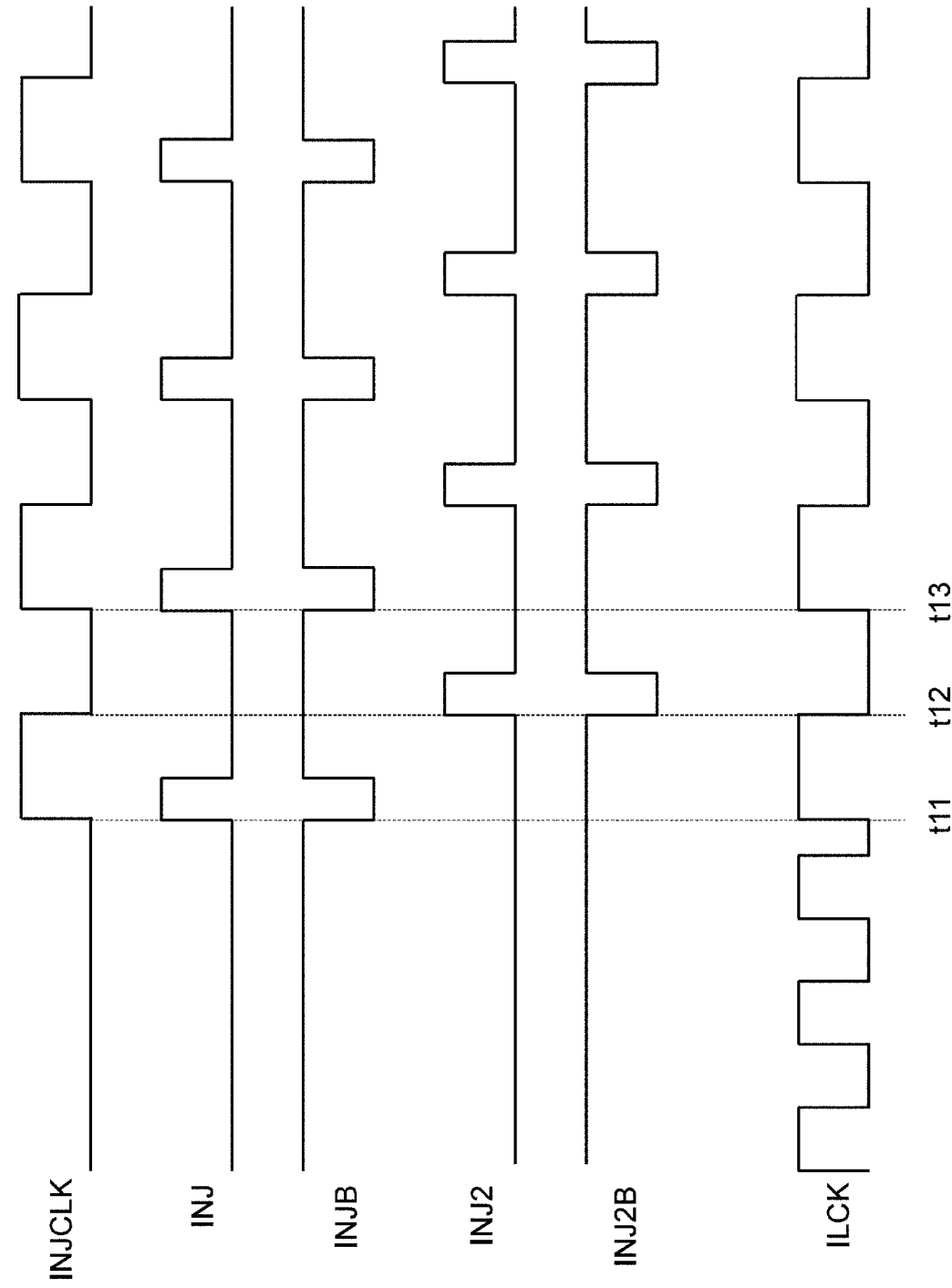
FIG. 10 is a timing diagram of signals in the ILICO in FIG. 9.

FIG. 10 is a timing diagram of the signals in the ILICO 3a in FIG. 9. When a rising edge of the input clock signal INJCLK is input at time t11, the pulse generator 12 generates the second signal INJ and the first signal INJB both with a certain pulse width. As a result, the transistor Q5 in the first current control circuit 32a is turned on so that a current at a level corresponding to a level of the control voltage V_LPF output from the LPF 10 passes between the source and drain of the transistor Q3 and between the source and drain of the transistor Q5 and is injected to the output node of the first one of the first inverters 34. At this time, the transistor Q6 in the second current control circuit 33a is turned on so that a current is extracted from the output node of the first one of the second inverters 35 to the grounding voltage node VSS.

When a falling edge of the input clock signal INJCLK is input at time t12, the pulse generator 12 generates the fourth signal INJ2 and the third signal INJ2B both with a certain pulse width. As a result, the transistor Q8 in the first current control circuit 32a is turned on so that a current at a level corresponding to a level of the control voltage V_LPF output from the LPF 10 passes between the source and drain of the transistor Q3 and between the source and drain of the transistor Q8 and is injected to the output node of the first one of the second inverters 35. At this time, the transistor Q9 in the second current control circuit 33a is turned on so that a current is extracted from the output node of the first one of the first inverters 34 to the grounding voltage node VSS. At time t13, an operation similar to that at time t11 is performed.

Figure 11:
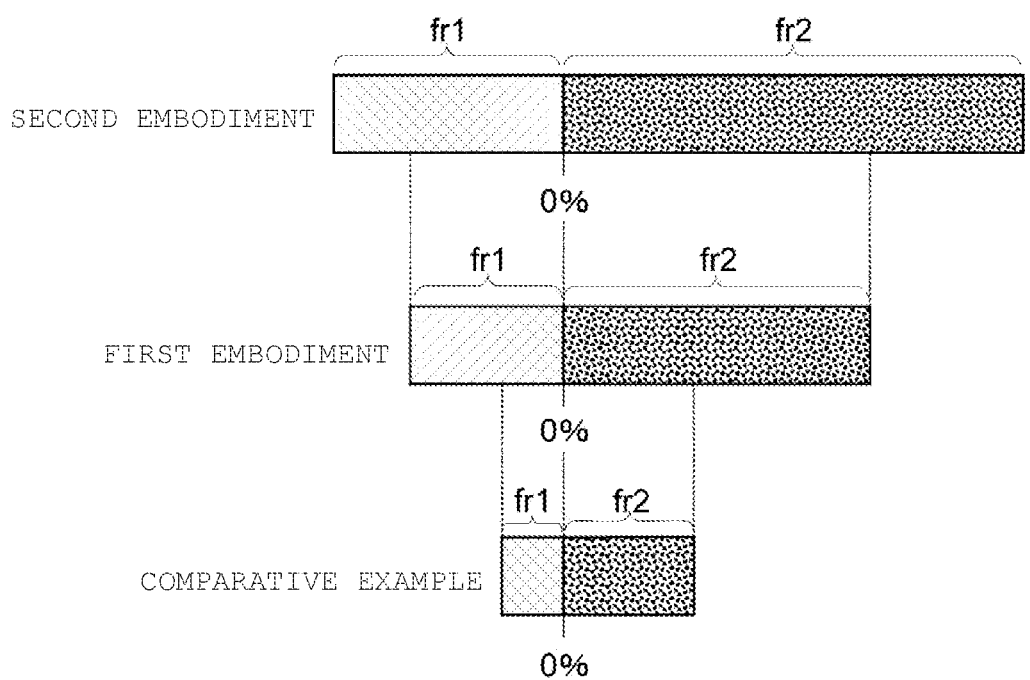
FIG. 11 is a diagram illustrating a frequency range of an oscillation signal output from the ILICO in FIG. 9.

FIG. 11 is a diagram illustrating a frequency range of an oscillation signal output from the ILICO 3a in FIG. 9. FIG. 11 illustrates not only the frequency range of the ILICO 3a in FIG. 9 but also the frequency range according to the first embodiment in FIG. 5 and the frequency range according to the comparative example in FIG. 8 for comparison.

The ILICO 3a in FIG. 9 can further widen the first frequency range fr1 in which the free-run frequency can be increased to the target frequency when the free-run frequency is lower than the target frequency than the frequency range in FIG. 5. Similarly, the ILICO 3a in FIG. 9 can further widen the second frequency range fr2 in which the free-run frequency can be decreased to the target frequency when the free-run frequency is higher than the target frequency than the frequency range in FIG. 5.

In this way, according to the second embodiment, the current is injected to one of the output node of the first inverter 34 and the output node of the second inverter 35 and the current is extracted from the other output node in synchronization with both the rising edge and the falling edge of the input clock signal INJCLK. Therefore, it is possible to further widen the frequency range of the ILICO 3a of which oscillation frequency is variable in accordance with the oscillation frequency of the input clock signal INJCLK than in the first embodiment.

Third Embodiment

The ILICO 3 and the ILICO 3*a* according to the first and second embodiments each include the oscillation circuit 31 that includes the first series circuit 38 including the first inverters 34 of odd number (for example, three) connected in series and the second series circuit 39 including the second inverters 35 of odd number connected in series. The number of the first inverters 34 in the first series circuit 38 and the number of the second inverters 35 in the second series circuit 39 may be even.

Figure 12:
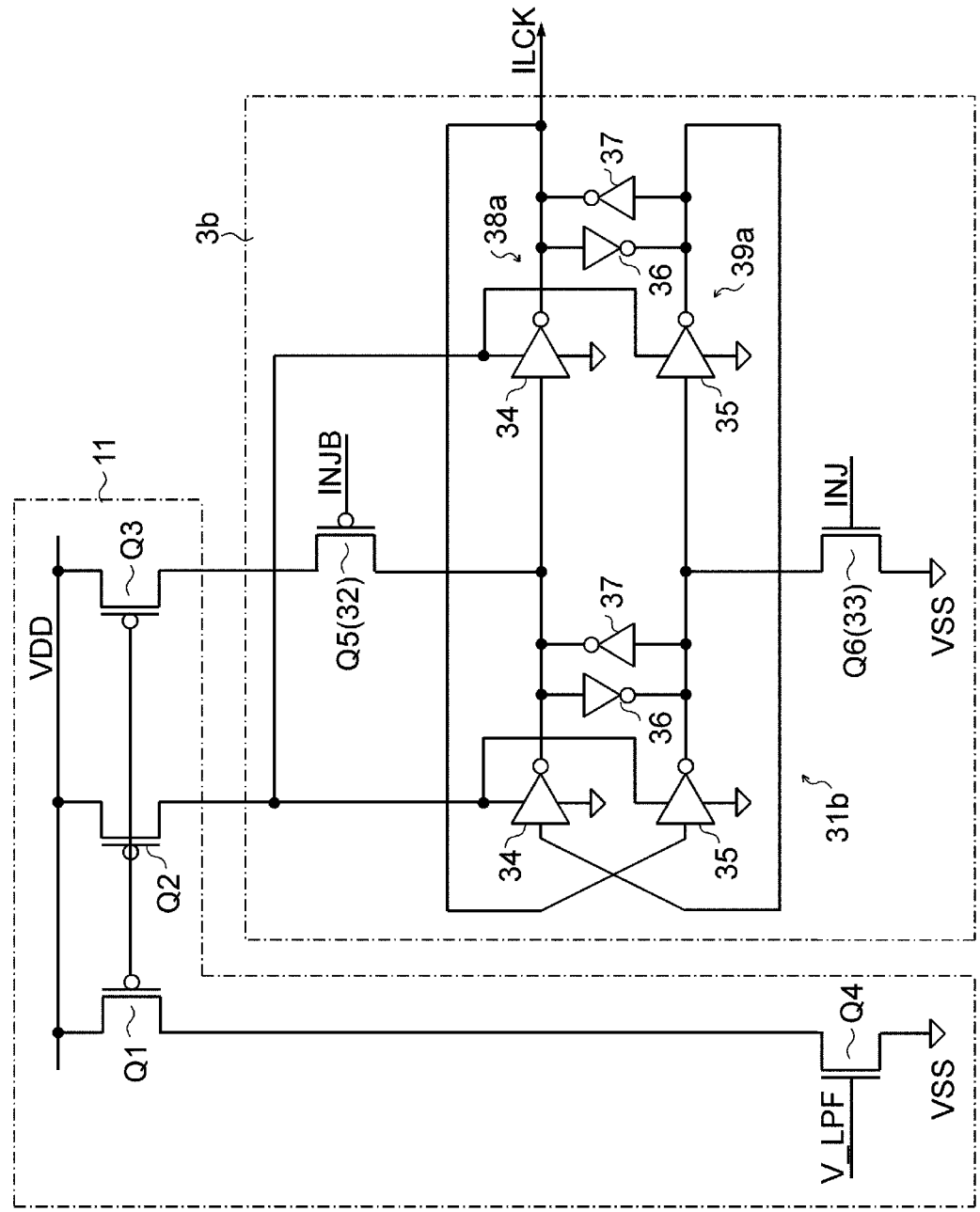
FIG. 12 is a circuit diagram illustrating a circuit configuration of a VIC and an ILICO according to a third embodiment.

FIG. 12 is a circuit diagram illustrating a circuit configuration of a VIC 11 and an ILICO 3*b* according to a third embodiment. In FIG. 12, elements common to those in FIG. 3 are denoted by the same reference numerals. The ILICO 3*b* in FIG. 12 includes an oscillation circuit 31*b*. The oscillation circuit 31*b* includes a first series circuit 38*a* including the first inverters 34 of even number (for example, two) connected in series and a second series circuit 39*a* including the second inverters 35 of even number connected in series. Two third inverters 36 and 37 are connected in mutually reverse directions to the output node of the first inverter 34 and the output node of the second inverter 35 in each pair.

Connection destinations of the output nodes of the first series circuit 38*a* and the second series circuit 39*a* in FIG. 12 are different from connection destinations of the output nodes of the first series circuit 38 and the second series circuit 39 in FIG. 3. The output node of the last one of the first inverters 34 in the first series circuit 38*a* in FIG. 12 is connected to an input node of the first one of the second inverters 35 in the second series circuit 39*a*. The output node of the last one of the second inverters 35 in the second series circuit 39*a* is connected to an input node of the first one of the first inverters 34 in the first series circuit 38*a*.

The first current control circuit 32 is connected to the output node of one of the first inverters 34 (for example, the first one) in the first series circuit 38*a* in FIG. 12, and the second current control circuit 33 is connected to the output node of one of the second inverters in the same pair.

In the VIC 11 and the ILICO 3*b* in FIG. 12, only the number of the first inverters 34 in the first series circuit 38*a* and the number of the second inverters 35 in the second series circuit 39*a* are different from those in FIG. 3, and a circuit operation is common. The current is injected to the output node of the first one of the first inverters 34 and the current is extracted from the output node of the first one of the second inverters 35, in synchronization with the rising edge or the falling edge of the input clock signal INJCLK. Therefore, it is possible to widen the frequency range of the ILICO 3*b* of which oscillation frequency can be locked in accordance with the oscillation frequency of the input clock signal INJCLK.

Figure 13:
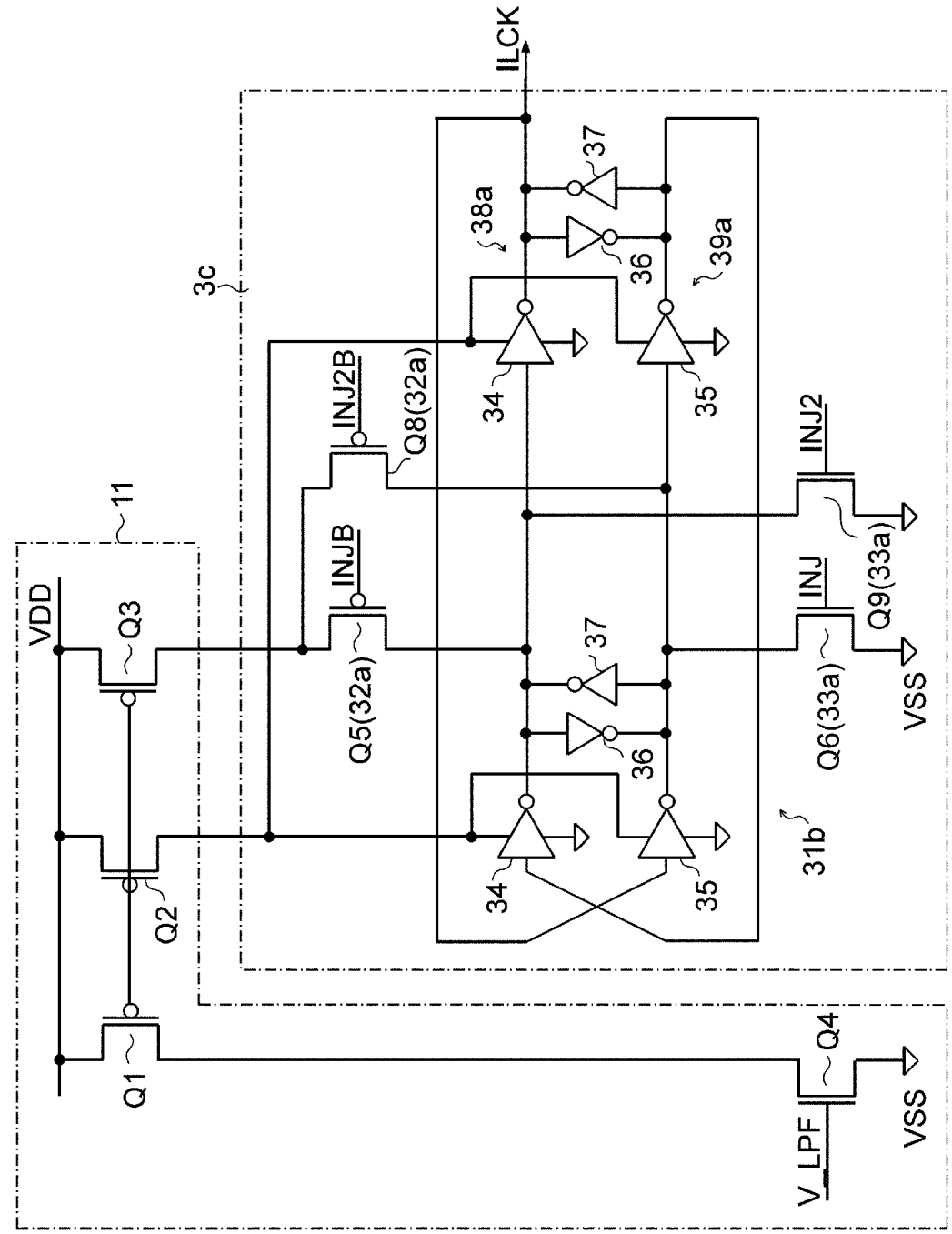
FIG. 13 is a circuit diagram illustrating a circuit configuration of a VIC and an ILICO according to a modified example of the third embodiment.

FIG. 13 is a circuit diagram illustrating a circuit configuration of a VIC 11 and an ILICO 3*c* according to a modified example of the third embodiment. In FIG. 13, elements common to those in FIG. 9 are denoted by the same reference numerals. Hereinafter, differences from FIG. 9 will be mainly described.

The first series circuit 38*a* and the second series circuit 39*a* of the ILICO 3*c* in FIG. 13 have similar configurations to FIG. 12, and differ from the first series circuit 38 and the second series circuit 39 of FIG. 9 with regard to a connection destination of each output node. The first series circuit 38*a* and the second series circuit 39*a* respectively include the first inverter 34 and the second inverter 35 with even stages.

In the ILICO 3*c* in FIG. 13, in synchronization with not only a rising edge of the input clock signal INJCLK but also a falling edge, the current is injected to one of the output node of the first inverter 34 and the output node of the second inverter 35 and the current is extracted from the other output node. Therefore, it is possible to perform locking to the frequency of the input clock signal INJCLK in a frequency range wider than that of the ILICO 3*b* in FIG. 12.

In this way, according to the third embodiment, the number of the first inverters 34 in the first series circuit 38*a* and the number of the second inverters 35 in the second series circuit 39*a* in the ILICO 3*c* are set to be even (a minimum of two stages). Therefore, the ILICO 3*c* that has a smaller circuit scale can be configured and the free-run frequency in a wide frequency range can be increased or decreased in accordance with the target frequency.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

The embodiments can be summarized as follows.

[Appendix 1]

A semiconductor integrated circuit including:
an oscillation circuit including first and second logic inversion elements outputting differential oscillation signals;
a current source configured to be able to inject a current to the oscillation circuit;
a first current control circuit configured to inject a current from the current source to an output node of the first logic inversion element in accordance with a first signal synchronized with a clock signal; and
a second current control circuit configured to extract a current to a reference voltage node from an output node of the second logic inversion element in accordance with a second signal synchronized with the clock signal.

[Appendix 2]

The circuit according to Appendix 1, in which the first and second logic inversion elements are connected to the reference voltage node.

[Appendix 3]

The circuit according to Appendix 1, in which the reference voltage node is a node at a grounding voltage level of the semiconductor integrated circuit.

[Appendix 4]

The circuit according to Appendix 1,
in which the oscillation circuit includes a first series circuit that includes the two or more first logic inversion elements connected in series and a second series circuit that includes the two or more second logic inversion elements connected in series,
in which an output node of the first logic inversion element at a last stage of the first series circuit is connected to an input node of the first logic inversion element at a first stage of the first series circuit,
in which an output node of the second logic inversion element at a last stage of the second series circuit is connected to an input node of the second logic inversion element at a first stage of the second series circuit,
in which the first current control circuit injects a current from the current source to an output node of the first logic inversion element at one stage of the first series circuit in accordance with the first signal, and in which the second current control circuit extracts a current from an output node of the second logic inversion element at one stage of the second series circuit in accordance with the second signal.

[Appendix 5]

The circuit according to Appendix 4, in which the number of connected stages of the first logic inversion elements in the first series circuit is odd, and in which the number of connected stages of the second logic inversion elements in the second series circuit is the same as the number of connected stages of the first logic inversion elements in the first series circuit.

[Appendix 6]

The circuit according to Appendix 1, in which the oscillation circuit includes a first series circuit that includes the two or more first logic inversion elements connected in series and a second series circuit that includes the two or more second logic inversion elements connected in series, in which an output node of the first logic inversion element at a last stage of the first series circuit is connected to an input node of the second logic inversion element at a first stage of the second series circuit, in which an output node of the second logic inversion element at a last stage of the second series circuit is connected to an input node of the first logic inversion element at a first stage of the first series circuit, in which the first current control circuit injects a current from the current source to an output node of the first logic inversion element at one stage of the first series circuit in accordance with the first signal, and in which the second current control circuit extracts a current from an output node of the second logic inversion element at one stage of the second series circuit in accordance with the second signal.

[Appendix 7]

The circuit according to Appendix 6, in which the number of connected stages of the first logic inversion elements in the first series circuit is even, and in which the number of connected stages of the second logic inversion elements in the second series circuit is the same as the number of connected stages of the first logic inversion elements in the first series circuit.

[Appendix 8]

The circuit according to Appendix 4, further including:

two third logic inversion elements connected in mutually reverse directions between output nodes of the first and second logic inversion elements at the same stage of the first and second series circuits.

[Appendix 9]

The circuit according to Appendix 4, further including:

a pulse generator configured to generate the first and second signals synchronized with a rising edge or a falling edge of the clock signal, in which the first current control circuit injects a current to an output node of one first logic inversion element in the first series circuit for a period in which a level of the first signal is active, and in which the second current control circuit extracts a current from an output node of one second logic inversion element in the second series circuit for a period in which a level of the second signal is active.

[Appendix 10]

The circuit according to Appendix 4, further including:

a pulse generator configured to generate the first and second signals synchronized with the clock signal and third and fourth signals synchronized with an inversion phase of the clock signal, in which the first current control circuit injects a current to an output node of one first logic inversion element in the first series circuit in accordance with the first signal and injects a current to an output node of the one second logic inversion element in the second series circuit in accordance with the third signal, and in which the second current control circuit extracts a current from an output node of one second logic inversion element in the second series circuit in accordance with the second signal and extracts a current from an output node of the one first logic inversion element in the first series circuit in accordance with the fourth signal.

[Appendix 11]

The circuit according to Appendix 4, in which the first current control circuit injects a current to an output node of the first logic inversion element at a predetermined connected stage in the first series circuit, and in which the second current control circuit extracts a current from an output node of the second logic inversion element at the predetermined connected stage in the second series circuit.

[Appendix 12]

A PLL circuit including:

the semiconductor integrated circuit according to any one of Appendices 1 to 11;

a first oscillator including the oscillation circuit;

a second oscillator configured to generate an oscillation signal with a frequency in accordance with a level of a current output from the current source; and a feedback control circuit configured to control feedback of the frequency of the oscillation signal generated by the second oscillator.

[Appendix 13]

The PLL circuit according to Appendix 12, in which the feedback control circuit includes a divider configured to divide a frequency of the oscillation signal of the second oscillator, a phase comparator configured to generate a phase difference signal between a reference signal and a signal divided by the divider, a charge pump configured to generate a current signal in accordance with the phase difference signal, and a loop filter configured to remove an unnecessary frequency component contained in the current signal, and in which the current source injects a current in accordance with an output signal of the loop filter to the first and second oscillators.

[Appendix 14]

The PLL circuit according to Appendix 13, in which a frequency of the reference signal is lower than a frequency of the clock signal, and in which the frequency of the oscillation signal is equal to the frequency of the clock signal.

[Appendix 15]

The PLL circuit according to Appendix 12, further including a level shifter configured to enlarge a voltage amplitude of the oscillation signal.

[Appendix 16]
A signal processing device including:
the PLL circuit according to any one of Appendices 12 to 15; and
a signal processing circuit configured to perform signal processing based on the oscillation signal output from the PLL circuit.

What is claimed is:

1. A semiconductor integrated circuit comprising:
an oscillation circuit including a first series circuit having a plurality of inverters, one of which is a first inverter, connected in series and a second series circuit having a plurality of inverters, one of which is a second inverter, connected in series, an oscillation signal being output from the first series circuit;
a first current control circuit connected between a current source and an output terminal of the first inverter and configured to control a current from the current source into the first series circuit in accordance with a first signal synchronized with a clock signal; and
a second current control circuit connected between an output terminal of the second inverter and a reference voltage node and configured to control a current from the second series circuit to the reference voltage node in accordance with a second signal synchronized with the clock signal.

2. The semiconductor integrated circuit according to claim 1, wherein
an output terminal of a last one of the inverters in the first series circuit is connected to an input terminal of a first one of the inverters in the first series circuit, and
an output terminal of a last one of the inverters in the second series circuit is connected to an input terminal of a first one of the inverters in the second series circuit.

3. The semiconductor integrated circuit according to claim 2, wherein a number of the inverters in the first series circuit is equal to a number of the inverters in the second series circuit, and is an odd number.

4. The semiconductor integrated circuit according to claim 1, wherein
an output terminal of a last one of the inverters in the first series circuit is connected to an input terminal of a first one of the inverters in the second series circuit, and
an output terminal of a last one of the inverters in the second series circuit is connected to an input terminal of a first one of the inverters in the first series circuit.

5. The semiconductor integrated circuit according to claim 4, wherein a number of the inverters in the first series circuit is equal to a number of the inverters in the second series circuit, and is an even number.

6. The semiconductor integrated circuit according to claim 1, wherein
the output terminal of the first inverter and the output terminal of the second inverter are connected to each other via a third inverter and a fourth inverter connected in parallel between the output terminal of the first inverter and the output terminal of the second inverter,
the third inverter having an input terminal connected to the output terminal of the first inverter and an output terminal connected to the output terminal of the second inverter,
the fourth inverter having an input terminal connected to the output terminal of the second inverter and an output terminal connected to the output terminal of the first inverter.

7. The semiconductor integrated circuit according to claim 1, wherein the second signal is an inverted signal of the first signal.

8. The semiconductor integrated circuit according to claim 1, wherein
the first current control circuit includes a first transistor connected between the current source and the first series circuit and having a gate to which the first signal is input, and
the second current control circuit includes a second transistor connected between the second series circuit and the reference voltage node and having a gate to which the second signal is input.

9. The semiconductor integrated circuit according to claim 8, further comprises:
a pulse generator configured to generate the first and second signals based on the clock signal input thereto.

10. The semiconductor integrated circuit according to claim 8, wherein
the first current control circuit also includes a third transistor connected between the current source and the second series circuit and having a gate to which a third signal is input, the third signal being in synchronization with the clock signal, and
the second current control circuit also includes a fourth transistor connected between the first series circuit and the reference voltage node and having a gate to which a fourth signal is input, the fourth signal being in synchronization with the clock signal.

11. The semiconductor integrated circuit according to claim 10, wherein
the second signal is an inverted signal of the first signal, and
the fourth signal is an inverted signal of the third signal.

12. The semiconductor integrated circuit according to claim 11, wherein
the first and second signals are in synchronization with one of rising or falling edges of the clock signal, and not in synchronization with the other one of the rising or falling edges of the clock signal, and
the third and fourth signals are in synchronization with the other one of the rising or falling edges of the clock signal, and not in synchronization with said one of the rising or falling edges of the clock signal.

13. The semiconductor integrated circuit according to claim 10, further comprises:
a pulse generator configured to generate the first, second, third, and fourth signals based on the clock signal input thereto.

14. A phase locked loop (PLL) circuit comprising:
a feedback control circuit including a feedback loop, the feedback loop including a current supply circuit, which is the current source, and a second oscillation circuit configured to generate a second oscillation signal at a frequency in accordance with a current from the current supply circuit; and
the semiconductor integrated circuit according to claim 1, wherein the oscillation circuit of the semiconductor integrated circuit is not part of the feedback loop.

15. The PLL circuit according to claim 14, wherein the feedback loop of the feedback control circuit further includes:
a divider configured to generate a frequency-divided oscillation signal of the second oscillation signal;

a phase comparator configured to generate a phase difference signal between a reference signal and the frequency-divided oscillation signal;

a charge pump configured to generate a current signal at a level corresponding to the phase difference signal; and a loop filter configured to remove an unnecessary frequency component contained in the current signal and generate a control voltage based on the current signal from which the unnecessary frequency component has been removed, wherein the current supply circuit is configured to generate a current at a level corresponding to the control voltage and supplies the generated current to the oscillation circuit and the second oscillation circuit.

16. The PLL circuit according to claim 15, wherein a frequency of the reference signal is less than a frequency of the clock signal, and a frequency of the oscillation signal is equal to the frequency of the clock signal.

17. The PLL circuit according to claim 14, further comprising:

a level shifter configured to increase an amplitude of the oscillation signal.

18. The PLL circuit according to claim 14, further comprising:

a pulse generator configured to generate the first and second signals based on the clock signal input thereto.

19. A system comprising:

the PLL circuit according to claim 14;

a first circuit configured to transmit the clock signal to the PLL circuit; and a second circuit configured to receive the oscillation signal and perform signal processing in accordance with the oscillation signal.

20. The system according to claim 19, wherein the second circuit comprises a memory controller configured to control a storage device.

* * * * *